(12) United States Patent
Tamura (10) Patent No.: US 7,004,025 B2
(45) Date of Patent: Feb. 28, 2006

(54) COMPOSITE SENSOR DEVICE AND METHOD OF PRODUCING THE SAME

(75) Inventor: Masaya Tamura, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 970 days.

(21) Appl. No.: 09/886,667

(22) Filed: Jun. 21, 2001

(65) Prior Publication Data

US 2002/0051258 A1    May 2, 2002

(30) Foreign Application Priority Data

Jun. 23, 2000  (JP) ............................. 2000-189652

(51) Int. Cl.
- *G01P 15/125* (2006.01)
- *G01P 9/04* (2006.01)
- *G01C 19/56* (2006.01)

(52) U.S. Cl. .................. 73/511; 73/514.32; 73/504.14; 73/514.29

(58) Field of Classification Search ............. 73/514.32, 73/514.29, 510, 511, 504.12, 504.14, 504.15, 73/504.04

See application file for complete search history.

(56) References Cited

U.S. PATENT DOCUMENTS 5,786,744 A * 7/1998 Nishio et al. ............... 338/14
5,996,409 A * 12/1999 Funk et al. ............. 73/504.04

FOREIGN PATENT DOCUMENTS

| EP | 0 849 578 | 6/1998 |
|----|-----------|--------|
| JP | 8-032090 A | 2/1996 |
| JP | 10-10148 | 1/1998 |
| JP | 10-010148 A | 1/1998 |
| JP | 10-154820 A | 6/1998 |
| JP | 10-239064 | * 9/1998 |
| JP | 10-239347 | 9/1998 |
| JP | 2000-028365 | 1/2000 |
| JP | 2000-164748 | 6/2000 |

* cited by examiner

Primary Examiner—Helen Kwok
(74) Attorney, Agent, or Firm—Keating & Bennett, LLP (57) ABSTRACT

A plane vibrator of an angular velocity sensor and a movable member of an acceleration sensor are provided in a spaced floating state on the same substrate. A lid is formed so as to cover and be spaced from the upper side of the plane vibrator and the movable member. A space defined by the substrate and the lid is sectioned into a angular velocity sensor space and an acceleration sensor space by use of a sectioning wall. The angular velocity sensor space is hermetically sealed to be in the vacuum state. The acceleration sensor space is hermetically sealed to be under atmospheric pressure. The plane vibrator is vibrated at a high frequency and a large amplitude so that the angular velocity detection sensitivity is enhanced. The movable member, even if vibration of the plane vibrator is transmitted thereto, is prevented from vibrating at a high frequency and a large amplitude, due to the damping effect of air. Thus, the acceleration detection sensitivity is enhanced.

3 Claims, 5 Drawing Sheets

| PART A-A | PART B-B |

PART A-A | PART B-B

PART A-A          PART B-B

COMPOSITE SENSOR DEVICE AND METHOD OF PRODUCING THE SAME

BACKGROUND OF THE INVENTION

1. Field of the Invention

The present invention relates to a composite sensor device having an angular velocity sensor and an acceleration sensor, and a method of producing the same.

2. Description of the Related Art

In some cases, an angular velocity sensor and an acceleration sensor, paired up with each other, are used. Considering such cases, a composite sensor device in which the angular velocity sensor and the acceleration sensor are integrated with each other was proposed. For example, Japanese Unexamined Patent Application Publication Nos. 10-10148 and 10-239347 disclose examples of the above composite sensor device, respectively. In the composite sensor device described in these Unexamined Patent Application Publications, the angular velocity sensor and the acceleration sensor are provided on the same substrate. Thus, advantageously, the device can be inexpensively produced and miniaturization can be easily achieved.

However, the composite sensor devices proposed as described above have the problems that the sensitivities for detection of an acceleration are undesirable. The reason is as follows.

The vibration type angular velocity sensor contains a vibrator. If an angular velocity is added while the vibrator is driven to vibrate at a constant frequency, a Coriolis force is generated. Due to the Coriolis force, the vibrator is displaced. The angular velocity is detected by sensing the displacement caused by the Coriolis force. The higher the velocity of the above driving vibration is, the larger the Coriolis force is. To improve the detection sensitivity of the angular velocity sensor, it is necessary to vibrate the vibrator of the angular velocity sensor at a high frequency of several kHz and moreover at a large amplitude of several mm for example.

However, the fine vibrator formed in a micro-machining technique is significantly influenced with damping caused by air. The damping force is generated in proportion to the velocity of the vibrator. Accordingly, if the vibrator is vibrated in the atmosphere at a high speed, namely, at the above-mentioned high frequency, and at a large amplitude, the damping exerts a large influence, so that the vibrator can not be vibrated at the above-mentioned high frequency and large amplitude. As a result, the detection sensitivity of the angular velocity sensor is remarkably deteriorated.

Accordingly, the following may be proposed. A lid is attached to a substrate having the angular velocity sensor and the acceleration sensor in such a manner as to cover, at a distance, the upper side the vibrator of the angular velocity sensor and a movable member constituting the acceleration sensor. Thus, the vibrator of the angular velocity sensor and the movable member of the acceleration sensor are accommodated in the same space defined by the lid and the substrate. The space is hermetically sealed in the vacuum state (reduced pressure state) in which the vibrator can be vibrated at a high frequency and at a set amplitude or higher sufficiently for detection of an angular velocity. Thereby, the vibrator of the angular velocity sensor can be vibrated at a desired high frequency and at a sufficiently large amplitude for detection of an angular velocity.

However, the movable body of the acceleration sensor, disposed in the vacuum space in which the vibrator of the angular velocity sensor is also set, is ready to be vibrated. When vibration of the vibrator of the angular velocity sensor is transmitted to the movable member of the acceleration sensor via the substrate, the movable member of the acceleration sensor is vibrated at a high frequency and a large amplitude similar to those of the vibrator of the angular velocity sensor. It is desirable that the movable member of the acceleration sensor is in the still state while no acceleration is applied. However, if the movable member of the acceleration sensor is vibrated at a high frequency and a large amplitude due to the transmitted vibration of the vibrator of the angular velocity sensor, as described above, the vibration at the high frequency becomes noisy, causing the problem that the acceleration can not be detected at a high sensitivity.

Moreover, if an acceleration having a resonance frequency component with respect to the movable member of the acceleration sensor is applied while the movable member of the acceleration sensor is disposed in the vacuum space as described above, the movable member resonates so that the amplitude is increased, irrespective of the strength of the acceleration. Thus, there arises the problem that the acceleration can not be accurately detected.

SUMMARY OF THE INVENTION

It is an object of the present invention to solve the above problems, and more particularly, to provide a composite sensor device in which both of the detection sensitivities of the angular velocity sensor and the acceleration sensor can be enhanced, and to provide a method of producing the composite sensor device.

To achieve the above objects, according to the present invention, there is provided a composite sensor device which comprises: an angular velocity sensor and an acceleration sensor integrated together on a displacement portion forming member disposed on a substrate, the angular velocity sensor having a vibrator to be vibrated and displaced by a Coriolis force caused by an acceleration, the acceleration sensor having a movable member to be moveably displaced by application of an acceleration and the vibrator and the movable member being spaced from each other. A lid is disposed on the upper side of the displacement portion forming member to cover, and be spaced from the vibrator of the angular velocity sensor and the movable member of the acceleration sensor. The substrate, the displacement portion forming member, and the lid defining a space for accommodating and sealing the vibrator of the angular velocity sensor and the movable member of the acceleration sensor, in such a manner that the vibrator and the movable member can be vibrated, the space being sectioned into an angular velocity sensor space for accommodating and sealing the vibrator of the angular velocity sensor and an acceleration sensor space for accommodating and sealing the movable member of the acceleration sensor such that the acceleration sensor is shielded from the angular velocity sensor. The angular velocity sensor space is sealed to be in one environment state, such as a vacuum state in which the vibrator of the angular velocity sensor can be vibrated at a high frequency of 1 kHz order or higher and a set amplitude or higher. The acceleration sensor space is sealed to be in a different environment state, such as an air pressure state for suppression of high frequency vibration in which the movable member of the acceleration sensor can be vibrated at a low frequency of 100 H3 or lower, and the vibrator of the angular velocity sensor is prevented from vibrating at a high frequency of 1 kHz order or higher and a set amplitude or higher even if vibration of the vibrator of the angular velocity sensor is transmitted to the movable member of the acceleration sensor. Alternatively, the angular velocity sensor may be filled with a damping agent for suppression of high frequency vibration.

Preferably, the substrate is formed of the supporting layer and the oxide layer of an SOI substrate comprising a supporting layer, an oxide layer, and an active layer laminated together, and the displacement portion forming member is formed of the active layer of the SOI substrate.

More preferably, the angular velocity sensor and the acceleration sensor have constant potential sites with which the sensors are maintained at set constant potentials, respectively, said constant potential site of the angular velocity sensor being electrically connected to the constant potential site of the acceleration sensor, and a connection electrode for connecting both of the constant potential site of the angular velocity sensor and the constant potential site of the acceleration sensor to an external circuit is provided.

Moreover, according to the present invention, there is provided a method of producing the composite sensor device which comprises forming the vibrator of the angular velocity sensor and the movable member of the acceleration sensor in the displacement portion forming member; after the formation process, disposing the lid on the upper side of the vibrator of the angular velocity sensor and the movable member of the acceleration sensor, joining the lid and the displacement portion forming member disposed on the substrate so that the vibrator of the angular velocity sensor is accommodated into the angular velocity sensor space and the movable member of the acceleration sensor is accommodated into the acceleration sensor space, and moreover, hermetically sealing the angular velocity sensor space in the first pressure state, e.g., a vacuum state in which the vibrator of the angular velocity sensor can be vibrated at a high frequency, such as 1 kHx or higher and a set amplitude or larger; placing the body having the lid joined to the upper side of the displacement portion forming member at a different air pressure state, e.g., an air pressure state for suppression of high frequency vibration so that the acceleration sensor space is set to be in the air-pressure state for suppression of high frequency vibration. Alternatively, the acceleration sensor space may be filled with a damping agent for suppression of high frequency vibration into the acceleration velocity sensor. The acceleration space may be placed at atmospheric pressure or filled with a dampening agent through a supply passage. Thereafter the supply passage is closed so that the acceleration sensor space is sealed.

In the above constitution of the invention, the vibrator of the angular velocity sensor and the movable member of the acceleration sensor are formed on the same displacement portion forming member, such as to be spaced from each other. The vibrator of the angular velocity sensor and the movable member of the acceleration sensor are accommodated and sealed in the spaces which are different from each other. That is, the vibrator of the angular velocity sensor is accommodated and sealed in the angular sensor space (namely, the space in the vacuum state in which the vibrator of the angular velocity sensor can be vibrated at a high frequency of 1 kHz or more and a large amplitude required for detection of an angular velocity). Also, the movable member of the acceleration sensor is accommodated and sealed in the acceleration sensor space (for example, sealed in the atmospheric pressure environment or in the space having the damping agent for suppression of high frequency vibration filled therein).

The vibrator of the angular velocity sensor, since it is disposed in the above-described vacuum environment, can be vibrated at a sufficiently high frequency for detection of an angular velocity, and a large amplitude, and can detect the angular velocity at a high sensitivity. Furthermore, the movable member of the acceleration sensor is disposed in the atmospheric pressure environment in which the movable member of the acceleration sensor can not be vibrated at a high frequency and a large amplitude, or disposed in the damping agent. Therefore, even if vibration of the vibrator of the angular velocity sensor is transmitted to the acceleration sensor side via the displacement portion forming member, the movable member of the acceleration sensor can be prevented from vibrating at a high frequency and a large amplitude. Thus, deterioration in sensitivity of the acceleration, caused by the high frequency vibration, can be avoided, and the sensitivity of acceleration detection can be enhanced.

Other features and advantages of the present invention will become apparent from the following description of the invention which refers to the accompanying drawings.

DETAILED DESCRIPTION OF THE PREFERRED EMBODIMENTS

Hereinafter, embodiments of the present invention will be described with reference to the drawings.

Figure 1:
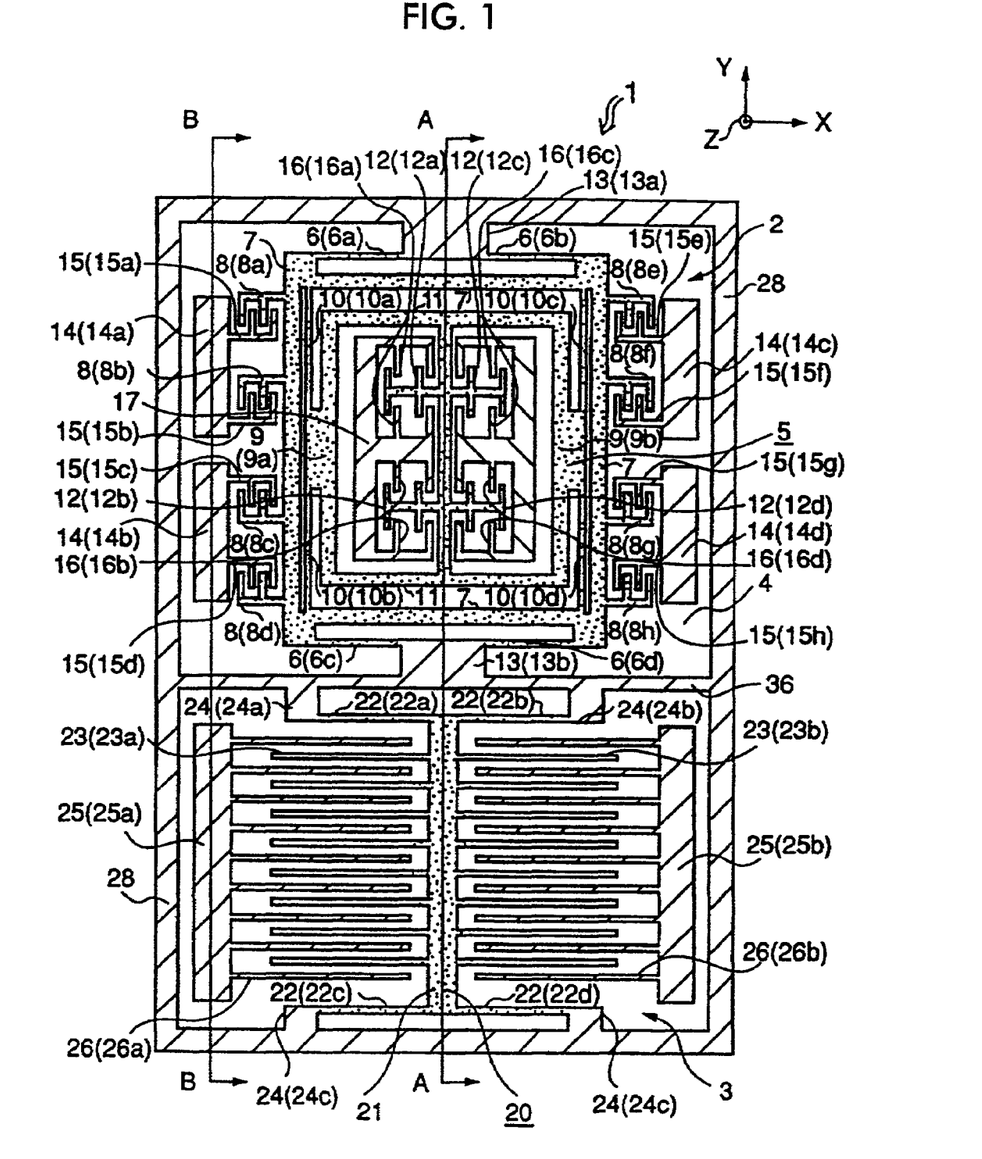
FIG. 1 is a plan view schematically showing an embodiment of the composite sensor device of the present invention.
Figure 2A:
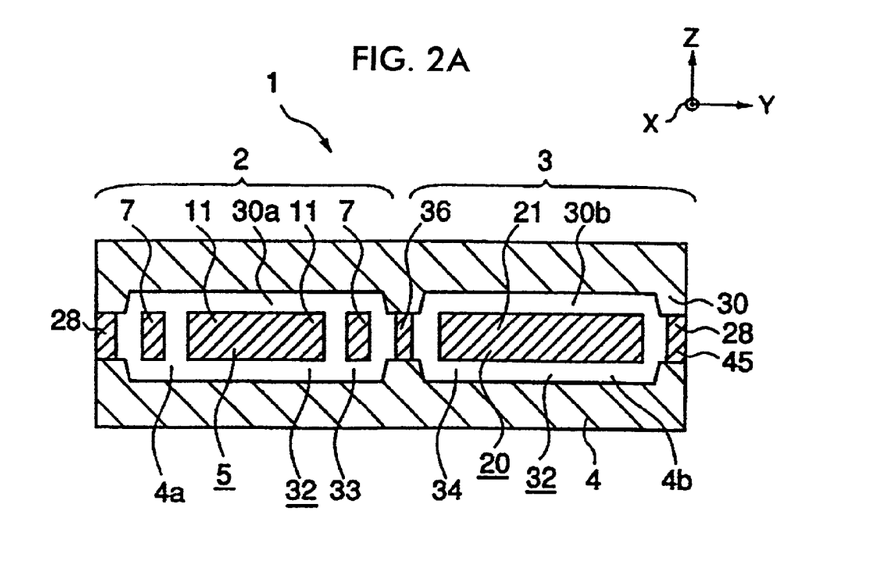
FIGS. 2A and 2B are explanatory views schematically showing the cross sections of the parts A—A and B—B of the composite sensor device shown in FIG. 1.
Figure 2B:
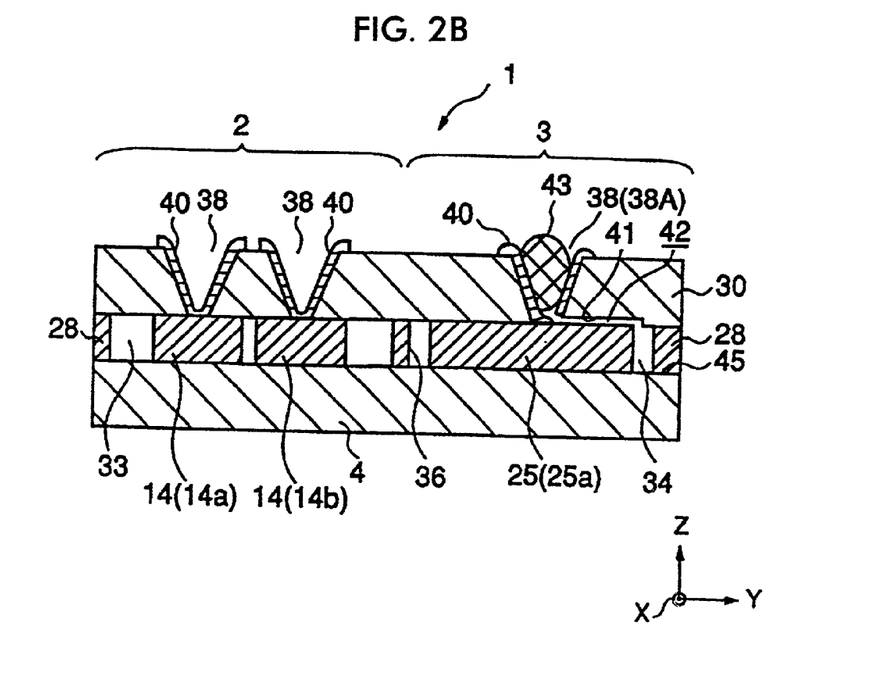

FIG. 1 is a schematic plan view of a composite sensor device according to an embodiment of the present invention. FIG. 2A is a schematic cross section of the part of the composite sensor device taken along line A—A in FIG. 1. FIG. 2B is a schematic cross section of the part of the composite sensor device taken along line B—B in FIG. 1.

A composite sensor device 1 shown in FIG. 1 and FIGS. 2A and 2B comprises an angular velocity sensor 2 and an acceleration sensor 3 formed integrally with each other. The composite sensor device 1 is formed by using a glass substrate 4 as a base, a glass substrate 30 as a lid, and a silicon substrate 45 as a displacement portion forming member.

The angular velocity sensor 2 in this embodiment contains a plane vibrator 5 as the vibrator of the angular velocity sensor. The plane vibrator 5 is formed by processing the silicon substrate 45. In the glass substrate 4, as shown in FIG. 2A, a concave portion 4a is formed in the area opposed to the plane vibrator 5. The plane vibrator 5 is in the floating state, and can be displaced, due to the concave portion 4a.

As shown in FIG. 1, the plane vibrator 5 comprises driving beams 6 (6a, 6b, 6c, and 6d), an outer frame 7, driving movable electrodes 8 (8a, 8b, 8c, 8d, 8e, 8f, 8g, and 8h), supporting portions 9 (9a and 9b), connecting beams 10

(10*a*, 10*b*, 10*c*, and 10*d*), an inner frame 11, and detection movable electrodes 12 (12*a*, 12*b*, 12*c*, and 12*d*). The plane vibrator 5 is supported by and fixed to fixed portions 13 (13*a* and 13*b*) fixedly formed on the glass substrate 4.

As shown in FIG. 1, both of the respective driving beams 6*a* and 6*b* of the plane vibrator 5 on one side thereof are connected to the fixed portion 13*a*, while both of the respective driving beams 6*c* and 6*d* on an opposite side thereof are connected to the fixed portion 13*b*. All of the driving beams 6*a*, 6*b*, 6*d*, and 6*d* are connected to the outer frame 7. The driving movable electrodes 8 (8*a*, 8*b*, 8*c*, 8*d*, 8*e*, 8*f*, 8*g*, and 8*h*) are formed on the right and left side edges, shown in FIG. 1, of the outer frame 7.

Fixed portions 14 (14*a*, 14*b*, 14*c*, and 14*d*) are fixedly formed on the glass substrate 4, on both of the right and left sides, shown in FIG. 1, of the outer frame 7, in such a manner as to sandwich the outer frame 7 at spaced intervals. On these fixed portions 14, are formed driving fixed electrodes 15 (15*a*, 15*b*, 15*c*, 15*d*, 15*e*, 15*f*, 15*g*, and 15*h*) which are interdigitated with the driving movable electrodes 8.

Moreover, connecting beams 10 (10*a*, 10*b*, 10*c*, and 10*d*) are formed so as to extend from the outer frame 7. Both of the extending connecting beams 10*a* and 10*b* on the top sides are connected to the supporting portion 9*a*. Moreover, both of the connecting beams 10*c* and 10*d* on the top sides are connected to the supporting portion 9*b*, respectively.

Both of the supporting portions 9*a* and 9*b* are in communication with and are connected to the inner frame 11. Inside of the inner frame 11, the detection movable electrodes 12 (12*a*, 12*b*, 12*c*, and 12*d*) are formed in connection to the inner frame 11. In addition, inside of the inner frame 11, the detection fixed electrodes 16 (16*a*, 16*b*, 16*c*, and 16*d*) are formed in the fixing portion 17 fixedly formed on the glass substrate 4, and are interdigitated with the movable electrodes 12 at an interval between them, respectively.

Referring to the above-described angular sensor 2, when an AC drive voltage (drive signal) is applied between the driving fixed electrodes 15 and the driving movable electrodes 8 opposed to each other, the whole of the plane vibrator 5 is driven and vibrated about the fixed portions 13*a* and 13*b* as fulcrums, in the direction Y in FIG. 1, due to changes in strength of static power based on the drive voltage, by utilization of the elasticities of the respective driving beams 6 as levers.

As described above, when the whole of the plane vibrator 5, while it is being driven, is rotated about the center axis in the direction Z (the direction perpendicular to the space of FIG. 1), a Coriolis force is generated in the direction perpendicular to both of the driving direction (direction Y) of the plane vibrator 5, and the rotation center axis direction (direction Z) thereof, that is, in the direction X. Due to the Coriolis force in the direction X, the inner frame 7 is detection-vibrated about the supporting portions 9*a* and 9*b* as fulcrums in the direction X, relatively with respect to the outer frame 7, by utilization of the elasticities of the respective connecting beams 10. Similarly to the vibration of the inner frame 11, the detection movable electrodes 12 are vibrated in the direction X.

The angular velocity about the axis Z can be detected by sensing changes in static capacitance between the detection fixed electrodes 16 and detection movable electrodes 12, based on the above detection vibration in the direction X.

The acceleration sensor 3 contains a movable member 20 for the angular velocity sensor. The movable member 20 is formed by processing the same silicon substrate 45 on which the plane vibrator 5 of the angular velocity sensor 2 is formed. As shown in FIG. 2A, the concave portion 4*b* is formed on the glass substrate 4 in the area thereof opposed to the movable member 20. With the concave portion 4*b*, the movable member 20 is in the floating state, and can be displaced.

The movable member 20 comprises an overlying portion 21, supporting beams 22 (22*a*, 22*b*, 22*c*, and 22*d*), and detection movable electrodes 23 (23*a* and 23*b*), as shown in FIG. 1.

Both of the ends of the overlying portion 21 are connected to the fixed portions 24 (24*a*, 24*b*, 24*c*, and 24*d*) fixed to the glass substrate 4 by means of the supporting beams 22 (22*a*, 22*b*, 22*c*, and 22*d*). Moreover, the detection movable electrodes 23 (23*a* and 23*b*) are formed on the right and left edges, shown in FIG. 1, of the overlying portion 21. Moreover, fixed portions 25 (25*a* and 25*b*) are fixedly formed on the glass substrate 4 in such a manner to sandwich the right and left sides, shown in FIG. 1 of the overlying portion 21 at spaced intervals. On these fixed portions 25, detection fixed electrodes 26 (26*a* and 26*b*) are provided, in which the fixed electrodes 26 (26*a* and 26*b*) are interdigitated with the movable electrodes 23 at an interval between them, respectively.

In the above-described acceleration sensor 3, the movable member 20 can be displaced in the direction Y in FIG. 1. When an acceleration is applied in the direction Y, the overlying portion 21 is displaced in the direction Y, due to the acceleration. With this displacement, the interval between the detection movable electrodes 23 and the detection fixed electrodes 26 is changed. The change in the interval is detected as a change in static capacitance between the detection movable electrodes 23 and the detection fixed electrodes 26. Thus, the acceleration can be detected.

As shown in FIGS. 1, 2A, and 2B, a sealing portion 28 is formed, using the silicon substrate 45, in such a manner as to enclose the plane vibrator 5 of the angular velocity sensor 2 and the movable member 20 of the acceleration sensor 3. The sealing portion 28 is joined to the glass substrate 4. As shown in FIG. 2A, the glass substrate 30 is disposed on the upper side of the plane vibrator 5 of the angular velocity sensor 2 and the movable member 20 of the acceleration sensor 3. The glass substrate 30 is joined to the sealing portion 28. A space (sensor accommodating space) 32 for accommodating the plane vibrator 5 and the other elements of the angular velocity sensor 2, and the movable member 20 and the other elements of the acceleration sensor 3 is formed by the joining between the glass substrate 4 and the silicon substrate 45 and that between the glass substrate 30 and the silicon substrate 45.

Concave portions 30*a* and 30*b* are formed in the area opposed to the plane vibrator 5 of the angular velocity sensor 2 and the area opposed to the movable member 20 of the acceleration sensor 3. Therefore, the plane vibrator 5 of the angular velocity sensor 2 and the movable member 20 of the acceleration sensor 3 are movably accommodated in the sensor accommodating space 32.

In this embodiment, most characteristically, the sensor accommodating space 32 is sectioned into a space 33 for the angular velocity sensor and a space 34 for the acceleration sensor by means of a sectioning wall 36, and the space 33 for the angular velocity sensor and the space 34 for the acceleration sensor are hermetically sealed in the different states.

In the angular velocity sensor 2, as described above, it is necessary to vibrate the plane vibrator 5 at a high frequency of about several kHz and a set amplitude or higher required for detection of an angular velocity, for example, at a large amplitude of several mm. In an atmospheric pressure environment, the plane vibrator 5 can not be vibrated at the above-mentioned high frequency and large amplitude. Accordingly, it is required to dispose the plane vibrator 5, e.g., in a vacuum space of about 200 Pa.

On the other hand, in the acceleration sensor 3, it is required that the movable member 20 be vibrated at a low frequency of 100 Hz or lower. Accordingly, the movable member 20 may be placed in an atmospheric pressure environment. However, the movable member 20 of the acceleration sensor 3, if it is placed in the atmospheric pressure environment, cannot be vibrated at the above-mentioned high frequency and large amplitude, contributed by the atmospheric pressure (damping by air), when vibration having a high frequency of the plane vibrator 5 of the angular velocity sensor 2 is transmitted from the plane vibrator 5 side of the angular velocity sensor 2 to the movable member 20 side of the acceleration sensor 3.

Accordingly, the above-described embodiment has been devised to accommodate those conflicting requirements. That is, in the above-described embodiment, the sensor accommodating space 32 is sectioned into the angular velocity sensor space 33 and the acceleration sensor space 34, the plane vibrator 5 of the angular velocity sensor 2 is accommodated into the angular velocity sensor space 33, and the movable member 20 of the acceleration sensor 3 is accommodated in the acceleration sensor space 34, separately and independently, and the plane vibrator 5 of the angular velocity sensor 2 and the movable member 20 of the acceleration sensor 3 are placed in environments different from each other, respectively.

In particular, in this embodiment, the angular velocity sensor space 33 is hermetically sealed in the vacuum state where the plane vibrator 5 can be vibrated at a high frequency, e.g, of several kHz and a large amplitude, e.g., of about several mm. The acceleration sensor space 34 is hermetically sealed to be in the atmospheric pressure environment.

Accordingly, the plane vibrator 5 of the angular velocity sensor 2 can be vibrated at a high frequency and a large amplitude, due to the vacuum state. The angular velocity sensor 2 can detect an angular velocity at a high sensitivity. Moreover, even if high frequency vibration of the plane vibrator 5 is transmitted to the acceleration sensor 3 side, the movable member 20 of the acceleration sensor 3 can not be vibrated at a high frequency and a large amplitude, contributed by the atmospheric pressure in the acceleration sensor space 34. Thus, high frequency vibration of the movable member 20 can be prevented. For this reason, noises, caused by the high frequency vibration, can be reduced, and the acceleration detection sensitivity can be enhanced.

The plane vibrator 5 of the angular velocity sensor 2 and the movable member 20 of the acceleration sensor 3 are constant potential sites which are maintained at a set constant potential (for example, ground potential). The plane vibrator 5 and the movable member 20 are electrically connected to each other via the fixed portions 13, the sectioning wall 36, the fixed portions 24, and sealing portion 28, as shown in FIG. 1.

For example, for the glass substrate 30, a through-hole (not shown) is provided so as to extend from the front surface side of the substrate 30 to one of the fixed portions 13, the sectioning wall 36, the fixed portions 24, and the sealing portion 28. A metal film is formed on the inner wall and the bottom of the through-hole, so that the plane vibrator 5 and the movable member 20 can be electrically connected to an external circuit, that is, can be grounded, via the metal film, the fixed portions 13, the sectioning wall 36, the fixed portions 24. In other words, the fixed portions 13, the sectioning wall 36, the fixed portions 24, or the sealing portion 28, with which the metal film in the through-hole contacts, functions as a connection electrode for electrically connecting both of the plane vibrator 5 and the movable member 20 to an external circuit.

Furthermore, in this embodiment, as shown in FIG. 2B, through holes 38 are formed in the glass substrate 30 so as to extend from the front surface side of the substrate 30 to the fixed portions 14 and 17 of the angular velocity sensor 2 and the fixed portions 25 of the acceleration sensor 3. Metal films 40 are formed on the inner walls and the bottoms of the through-holes 38, respectively. The driving fixed electrodes 15 and the detection fixed electrodes 16 of the angular velocity sensor 2 and the detection fixed electrodes 26 of the acceleration sensor 3 can be electrically connected to an external circuit via the metal films 40 and the fixed portions 14, 17, and 25. Thereby, a voltage for driving and vibrating the plane vibrator 5 can be applied from the external drive circuit (not shown) to the driving fixed electrodes 15 provided in the sensor accommodation space 32, a voltage corresponding to the static capacitance between the detection fixed electrodes 16 and the detection movable electrodes 12 can be output to an external signal processing circuit (not shown), and a voltage corresponding to the static capacitance between the detection fixed electrodes 26 and the detection movable electrodes 23 can be output to an external signal processing circuit (not shown).

Moreover, in this embodiment, as shown in FIG. 2B, a groove 41 for forming a gap between the substrate 30 and the fixing portion 25 is formed on the glass substrate 30. A supply passage 42 for communication-connecting the acceleration sensor space 34 to the exterior is formed by the groove 41 and the through-hole 38A in communication with the groove 41. A sealing member (e.g., resin or solder) 43 is formed in the through-hole 38A of the supply passage 42 so that the supply passage 42 is filled. Thus, the acceleration sensor space 34 is hermetically sealed.

Hereinafter, an embodiment of a method of producing a composite sensor device of the present invention will be described with reference to FIG. 3 and the composite sensor device 1 shown in FIGS. 1, 2A, and 2B. FIGS. 3A to 3G are cross sectional views of the parts corresponding to the parts A—A and B—B shown in FIG. 1.

Figure 3A:
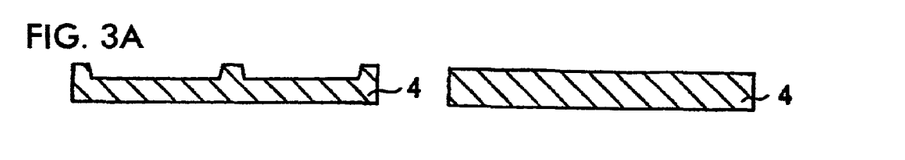
FIGS. 3A to 3E are explanatory views showing an embodiment of the method of producing the composite sensor device of FIG. 1.
Figure 3B:
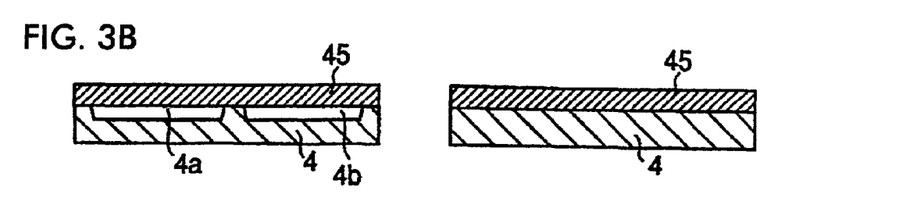

For example, as shown in FIG. 3A, first, the glass substrate 4 as the base is processed to form the concave portions 4a and 4b in the glass substrate area opposed to the plane vibrator 5 of the angular velocity sensor 2 and the glass substrate area opposed to the movable member 20 of the acceleration sensor 3, e.g., using an etching technique or the like. Furthermore, as shown in FIG. 3B, the silicon substrate 45 as a displacement portion forming member is anode-joined to the upper side of the glass substrate 4 having the concave portions 4a and 4b formed thereon.

Figure 3C:
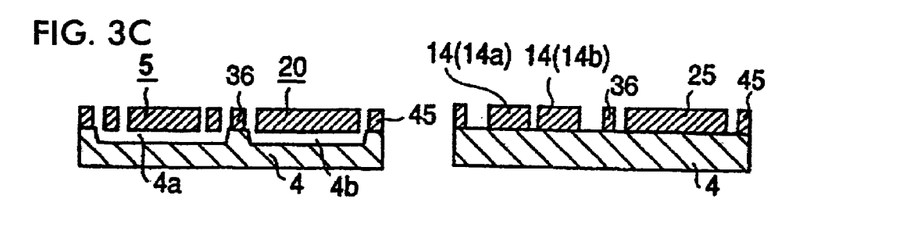

Next, as shown in FIG. 3C, the silicon substrate 45 is processed to form a pattern, as shown in FIG. 1, using a technique such as photolithography, etching, or the like. Thereby, the plane vibrator 5 of the angular velocity sensor 2 and the movable member 20 of the acceleration sensor 3 are formed so as to be in the floating state with respect to the glass substrate 4 (that is, in the state that they are spaced from and are movable with respect to the glass substrate).

Figure 3D:
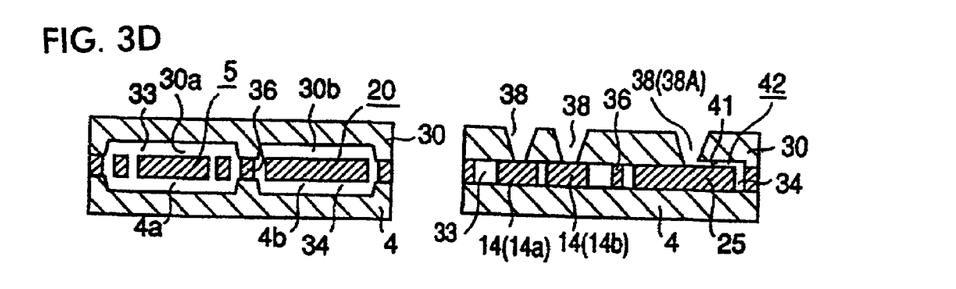

After this, as shown in FIG. 3D, the glass substrate 30 as the lid is anode-joined to the upper side of the silicon substrate 45 having the plane vibrator 5 and the movable member 20 formed thereon, in a vacuum space having a vacuum degree at which the plane vibrator 5 can be vibrated at a high frequency and a set amplitude or larger (for example, an amplitude of about several mm). In the glass substrate 30, the concave portions 30a and 30b are formed in the area thereof opposed to the plane vibrator 5 and in the areas thereof opposed to the plane vibrator 5 and the movable member 20 before the anode-joining, in the same formation technique as that for the concave portions 4a and 4b of the glass substrate 4. Thus, as described above, the glass substrate 30 is anode-joined to the upper side of the silicon substrate 45, whereby the angular velocity sensor space 33 accommodating the plane vibrator 5 is formed in such a manner that the vibrator 5 can be vibrated, and also, the acceleration sensor space 34 accommodating the movable member 20 in such a manner that the movable member 20 can be vibrated is formed. Simultaneously, the angular velocity sensor space 33 accommodating the plane vibrator 5 is hermetically sealed to be in the vacuum state.

Moreover, the through-holes 38 and the groove 41 are formed in the glass substrate 30 before the joining. When the glass substrate 30 and the silicon substrate 45 are anode-joined to each other, the supply passage 42 is formed by the through-hole 3 8A and the groove 41.

Figure 3E:
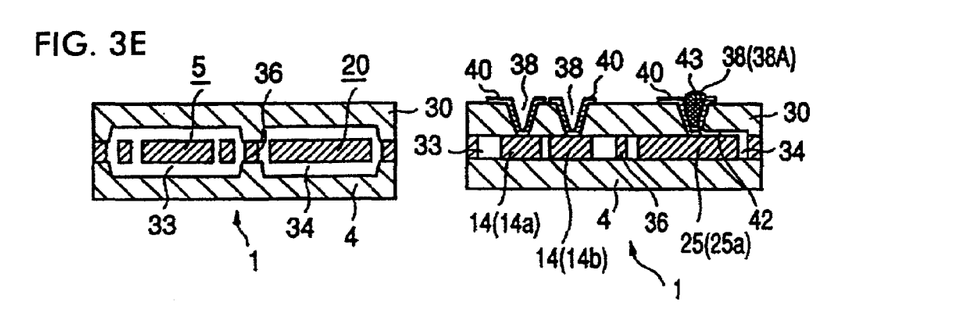

After this, as shown in FIG. 3E, the metal films 40 are formed on the inner walls and the bottoms of the through-holes 38 in a film-forming technique such as sputtering or the like.

Then, the body comprising the glass substrates 4 and 30 and the silicon substrate 45 anode-joined to each other is removed from the vacuum space into the atmosphere. Thereby, air enters the acceleration sensor space 34 through the supply passage 42, so that the acceleration sensor space 34 is at the atmospheric pressure. After the acceleration sensor space 34 is placed at the atmospheric pressure as described above, the through-hole 38A is sealed by the sealing member 43, which may be resin, solder, or the like. Thus, the supply passage 42 is filled, so that the acceleration sensor space 34 is hermetically sealed at atmospheric pressure (that is, the atmospheric pressure under which the movable member 20 can be vibrated at a low frequency of up to 100 Hz and a large amplitude, and even if the vibration of the plane vibrator 5 is transmitted to the movable member 20, the movable member 20 can be prevented from vibrating at a high frequency and a large amplitude).

In this embodiment, for the sealing member 43, a material having a high viscosity in the melted state is used, and the cross sectional area of the groove 41 part in the supply passage 42 is very narrow. Therefore, the following situation can be avoided: when the sealing member 43 in the through-hole 38 is melted to fill the through-hole 38A (or when the sealing member 43 in the melted state is placed in the through-hole 38), the sealing member 43 in the melted state passes through the groove 41 to intrude into the acceleration sensor space 34.

In this embodiment, the angular velocity sensor space 33 where the plane vibrator 5 of the angular velocity sensor 2 is accommodated is hermetically sealed in the vacuum state in which the plane vibrator 5 can be vibrated at a high frequency and a set amplitude or larger. Moreover, the acceleration sensor space 34 where the movable member 20 of the acceleration sensor 3 is accommodated is hermetically sealed to be in the atmospheric pressure state. With this configuration, the plane vibrator 5 can be vibrated at a high frequency and a large amplitude, and the angular velocity can be detected at a high sensitivity. Moreover, even if the high frequency vibration of the plane vibrator 5 is transmitted to the acceleration sensor 3 side, the movable member 20 of the acceleration sensor 3 can not be vibrated at the above-mentioned high frequency and large amplitude, due to the atmospheric pressure. Thus, noise, caused by the high frequency vibration, can be suppressed, and an acceleration can be detected at a high sensitivity.

Moreover, in this embodiment, the connection electrodes for connecting both of the plane vibrator 5 and the movable member 20, which are constant potential sites, to an external circuit is provided. Thus, the composite sensor device 1 can be reduced in size, in contrast to connection electrodes for the plane vibrator 5 and those for the movable member 20 which are separately provided. Furthermore, time and labor required for wiring work to connect the composite sensor device 1 to an external circuit can be reduced.

Moreover, in this embodiment, in the process of producing the composite sensor device 1, the same silicon substrate 45 is used to form the plane vibrator 5 of the angular velocity sensor 2 and the movable member 20 of the acceleration sensor 3 simultaneously. Thus, a process of combining the plane vibrator 5 of the angular velocity sensor 2 and the movable member 20 of the acceleration sensor 3 is unnecessary. Accordingly, the production process can be simplified, and deviations in detection axes of the angular velocity sensor 2 and the acceleration sensor 3 can be prevented.

It should be noted that the prevent invention is not limited to the above embodiment, and can adopt different embodiments. For example, in the above-described embodiment, the acceleration sensor space 34 is hermetically sealed in the atmospheric pressure environment. However, an air pressure state may be used instead in which the movable member 20 of the acceleration sensor 3 can be vibrated at a low frequency of up to 100 Hz, and the movable member 20, even if vibration of the plane vibrator 5 of the angular velocity sensor 2 is transmitted, can be suppressed from vibrating at a high frequency and a set amplitude or higher. Accordingly, the invention is not limited to use of atmospheric pressure in the acceleration sensor space 34.

Moreover, in the above embodiment, the acceleration sensor space 34 is hermetically sealed to be in the atmospheric pressure state using air. However, the acceleration sensor space 34 may be hermetically sealed using an environment of inert gas, instead of air.

Moreover, for example, the acceleration sensor space 34 may be hermetically sealed by filling the space 34 with a damping agent such as silicone oil or the like Furthermore, in the above-described embodiment, as the base, the glass substrate 4 is used. Substrates made of other materials such as a silicon substrate may be employed as the base. Moreover, as the lid, the glass substrate 30 is used. Other materials such as silicon or the like may be used for the lid.

Furthermore, in the above-described embodiment, the plane vibrator 5 of the angular velocity sensor 2 and the movable member 20 of the acceleration sensor 3 are maintained at ground potential. The plane vibrator 5 and the movable member 20 may be maintained at a constant potential, that is, at a constant potential other than the ground potential.

In addition, in the above embodiment, regarding the through-hole 38A formed in the glass substrate 30, the metal film 40 formed on the inner wall and the bottom thereof has both of the function of electrically connecting the fixed portions 25 to the exterior and the function of constituting the supply passage 42. A through-hole for electrically connecting the fixed portions 25 to the exterior and a through-hole for constituting the supply passage 42 may be separately provided. In the case in which the through-hole exclusively used for constituting the supply passage 42 is formed, and moreover, the through-hole is filled with the resin sealing member, it is unnecessary to form the metal film on the inner wall of the through-hole. Furthermore, in the case in which a solder sealing member is employed, a metal film is formed on the inner wall of the trough-hole as an undercoat film.

Furthermore, in the above embodiment, the silicon substrate (displacement portion forming member) 45 anode-joined to the upper side of the glass substrate 4 as the base and the glass substrate 30 as the lid may be anode-joined to each other in a vacuum chamber, so that the angular velocity sensor space 33 is hermetically sealed to be in the vacuum state. For example, as an application example, a degassing passage for allowing the angular velocity sensor space 33 to communicate with the outside is formed. After the anode-joining, the angular velocity sensor space 33 is evacuated through the degassing passage. After the angular velocity sensor space 33 is placed into the desired vacuum state, the degassing passage is filled so that the angular velocity sensor space 33 is hermetically sealed to be in the vacuum state.

Moreover, in the above embodiment, the concave portions 4a and 4b are formed in the areas of the glass substrate under the plane vibrator 5 of the angular velocity sensor 2 and the movable member 20 of the acceleration sensor 3 and opposed thereto. Thereby, the plane vibrator 5 and the movable member 20 are formed so as to be in the floating state with respect to the glass substrate 4. For example, as shown in FIGS. 4A and 4E, the plane vibrator 5 and the movable member 20 may be set to be in the floating state with respect to the glass substrate 4 by forming the silicon substrate area 45a for forming the plane vibrator 5 and the silicon substrate area 45b for forming the movable member 20 so as to have a smaller thickness than the other sites on the silicon substrate.

The composite sensor device 1 shown in FIG. 4E can be produced as follows. Referring to the production process for the composite sensor device 1 which will be described below, the angular velocity sensor 2 of the composite sensor device 1 contains the plane vibrator 5 having a pattern similar of that of FIG. 1, and the acceleration sensor 3 contains the movable member 20 having a pattern similar to that of FIG. 1. Moreover, FIGS. 4A–4E are cross sectional views of the parts corresponding to the parts A—A and B—B shown in FIG. 1.

Figure 4A:
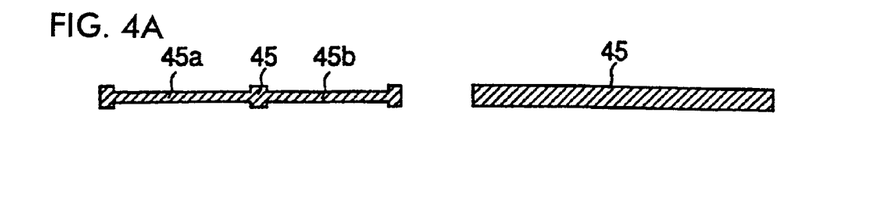
FIGS. 4A to 4E are explanatory views other embodiments of the composite sensor device and an example of the production method.
Figure 4B:
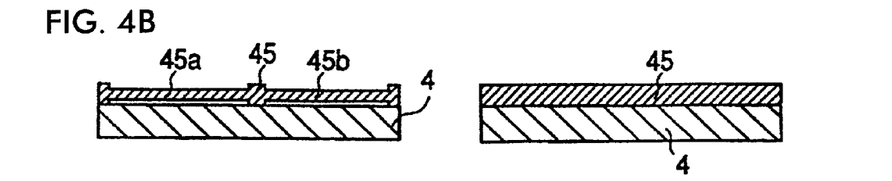

For example, as shown in FIG. 4A, the area 45a of the silicon substrate 45 where the plane vibrator 5 is to be formed and the area 45b thereof where the movable member 20 is to be formed are thinned from both of the front and back sides thereof, in an etching technique or the like. Then, as shown in FIG. 4B, the glass substrate 4 as the base is anode-joined to the under side of the silicon substrate 45.

Figure 4C:
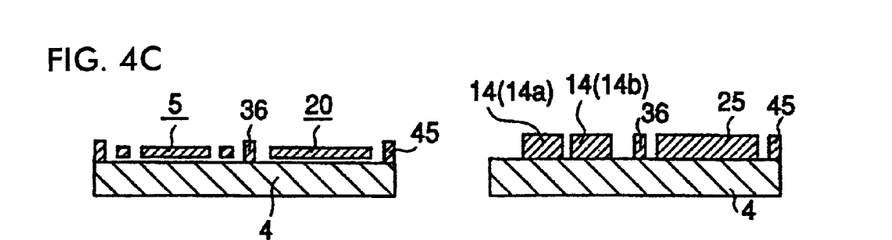
Figure 4D:
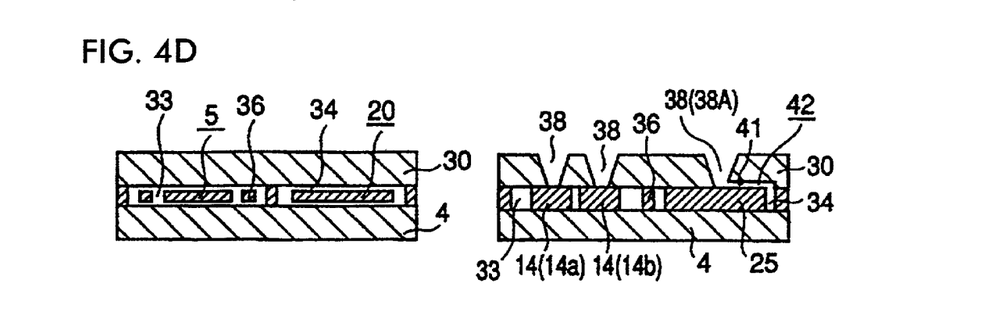
Figure 4E:
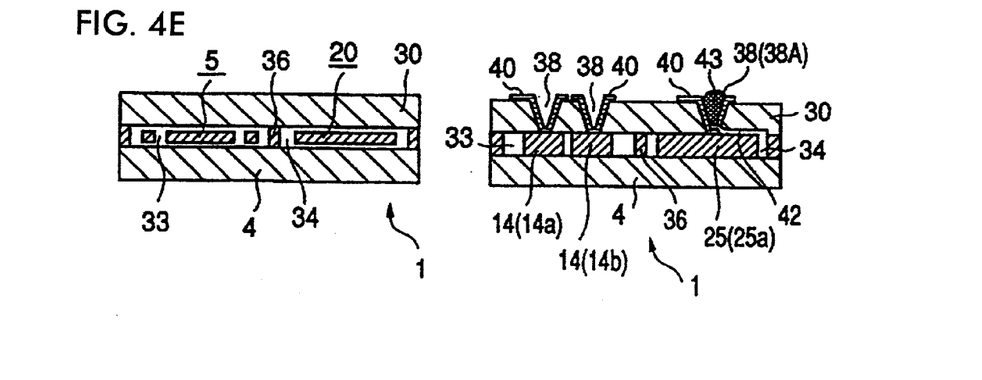

Next, as shown in FIG. 4C, the thin areas 45a and 45b of the silicon substrate 45 are worked in a technique such as photolithography, etching, or the like to form the patterns as shown in FIG. 1. Thereby, the plane vibrator 5 of the angular velocity sensor 2 and the movable member 20 of the acceleration sensor 3 are formed so as to be in the floating state with respect to the glass substrate 4. Next, as shown in FIG. 4D, the glass substrate 30 as the lid is anode-joined to the upper side of the silicone substrate 45 having the plane vibrator 5 and the movable member 20 formed thereon. On the glass substrate 30, the groove 41 for forming the supply passage 42 and through-holes 38 are formed before the anode-joining. Similarly to the above embodiment, the glass substrate 30 is anode-joined to the silicon substrate 45, whereby the angular velocity sensor space 33 and the acceleration sensor space 34 are formed, and simultaneously, the plane vibrator 5 of the angular velocity sensor 2 is accommodated in the angular velocity sensor space 33 in such a manner that the plane vibrator 5 can be vibrated. Moreover, the movable member 20 of the acceleration sensor 3 is accommodated in the acceleration sensor space 34 in such a manner that the movable member 20 can be displaced.

Referring to the anode-joining, similarly to the embodiment of FIGS. 3A–3E, the glass substrate 30 and the silicon substrate 45 are anode-joined to each other in a vacuum chamber having a degree of vacuum at which the plane vibrator 5 can be vibrated at a high frequency and a set amplitude or larger. Thereby, the angular velocity sensor space 33 is hermetically sealed to be in the vacuum state in which the plane vibrator 5 can be vibrated at a high frequency and a set amplitude or larger.

After the glass substrate 30 and the silicon substrate 45 are anode-joined to each other, as described above, the metal films 40 are formed in the through-holes 38, and the body of the glass substrate 4, the silicon substrate 45, and the glass substrate 30 anode-joined together are placed under atmospheric pressure, so that the acceleration sensor space 34 is placed into the atmospheric pressure state via the supply passage 42. After this, the supply passage 42 is filled with the sealing member 43, so that the acceleration sensor space 34 is air-tightly sealed to be in the atmospheric pressure state.

Figure 5A:
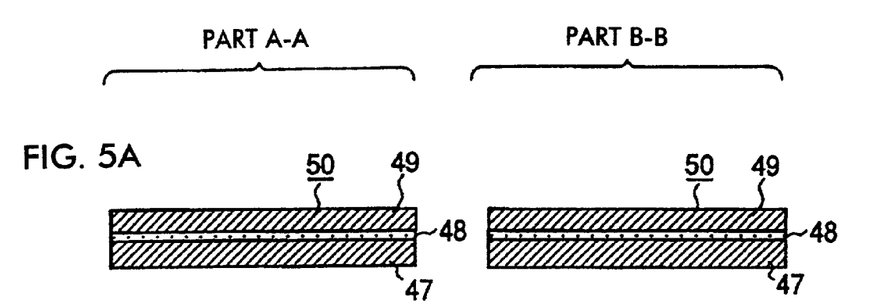
FIGS. 5A to 5E are explanatory views showing the other embodiments of the composite sensor device and an example of the production method.

In the above-described embodiment, as the base, the glass substrate 4 is used, and as the displacement portion forming member, the silicon substrate 45 is used. However, other materials may also be used. For example, an SOI (silicon on insulator) substrate 50 comprising a supporting layer (silicon layer) 47, an oxide layer (silicon dioxide layer) 48, and an active layer (silicon layer) 49 which are laminated to each other, as shown in FIG. 5A, may be used. That is, for example, the supporting layer 47 and the oxide layer 48 of the SOI substrate 50 may be used as the base, and the active layer 49 may be used as the displacement portion forming member.

The composite sensor device 1 using the above SOI substrate 50 can be produced as follows. In the description of a production process for the composite sensor device 1 using the SOI substrate 50, the angular velocity sensor 2 of the composite sensor device 1 contains the plane vibrator 5 having a pattern similar to that of FIG. 1, and the acceleration sensor 3 contains the movable member 20 having a pattern similar to that of FIG. 1. FIGS. 5A to 5E are cross sectional views of the parts corresponding to the parts A—A and B—B of FIG. 1.

Figure 5B:
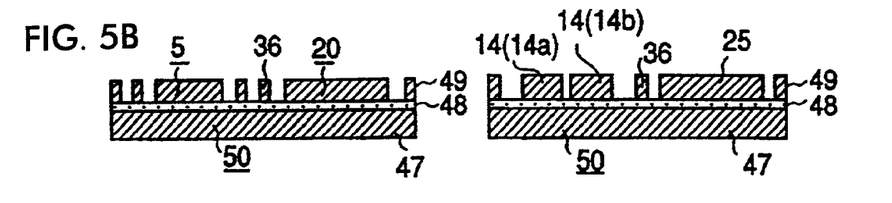

First, for example, as shown in FIG. 5A, the SOI substrate 50 is prepared. Next, as shown in FIG. 5B, the active layer 49 of the SOI substrate 50 is processed using a technique such as etching to have a pattern, as shown in FIG. 1. Thereby, the plane vibrator 5 of the angular velocity sensor 2 and the movable member 20 of the acceleration sensor 3 are formed.

Figure 5C:
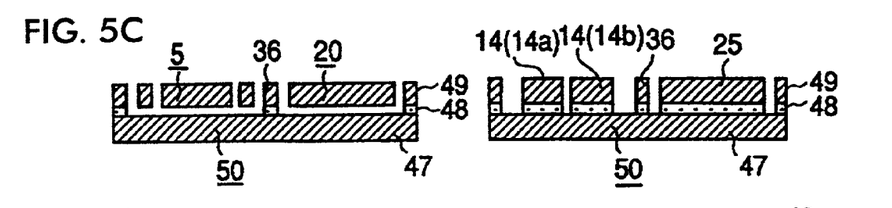

After this, as shown in FIG. 5C, the oxide layer 48 lying under the plane vibrator 5 and the movable member 20 is partially removed by etching a sacrificial layer or the like. Thereby, the plane vibrator 5 and the movable member 20 is placed into the floating state with respect to the supporting layer 47 (base).

Figure 5D:
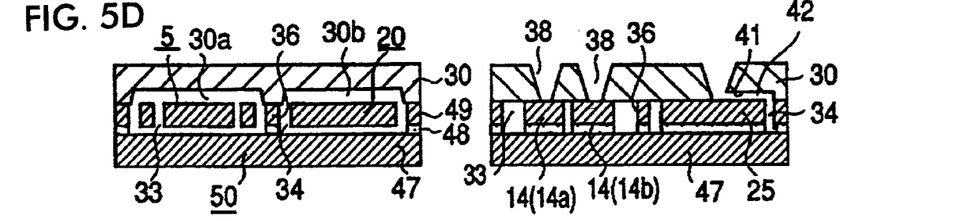

After this, as shown in FIG. 5D, the glass substrate 30 as the lid is anode-joined to the upper side of the active layer 49 having the plane vibrator 5 and the movable member 20 formed thereon. Similarly to the above embodiment, in the areas of the glass substrate 30 opposed to the plane vibrator 5 and the movable member 20, the concave portions 30a and 30b are formed, and moreover, the through-holes 38 and the groove 41 are formed, before the anode-joining. When the active layer 49 and the glass substrate 30 are anode-joined to each other, the angular velocity sensor space 33 and the acceleration sensor space 34 are formed, due to the concave portions 30a and 30, similarly to the above embodiments, and simultaneously, the plane vibrator 5 of the angular velocity sensor 2 and the movable member 20 of the acceleration sensor 3 are accommodated in the angular velocity sensor space 33 and the acceleration sensor space 34 in such a manner that they can be displaced therein.

Referring to the anode-joining, the glass substrate 30 and the active layer 49 are anode-joined to each other in a vacuum chamber having a degree of vacuum at which the plane vibrator 5 can be vibrated at a high frequency and a set amplitude or larger. Thereby, the angular velocity sensor space 33 is hermetically sealed to be in the vacuum state in which the plane vibrator 5 can be vibrated at a high frequency and a set amplitude or larger.

Figure 5E:
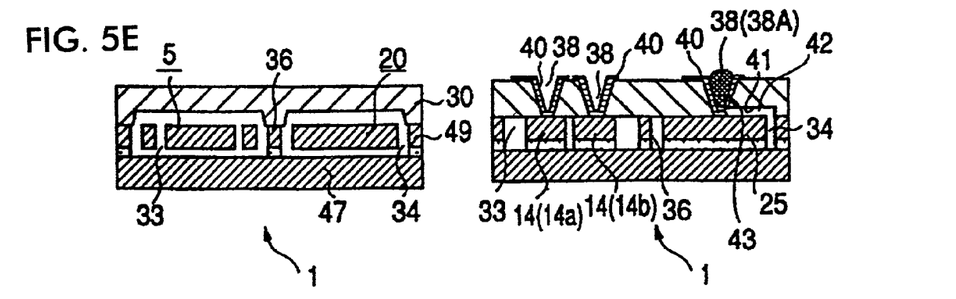

After the anode-joining, similarly to the above embodiments, the metal films 40 are formed in the through-holes 38, and the body of the SOI substrate 50 and the glass substrate 30 joined together is placed under the atmospheric pressure, so that the acceleration sensor space 34 has the atmospheric pressure through the supply passage 42. After this, as shown in FIG. 5E, the supply passage 42 is filled with the sealing member 43, so that the acceleration sensor space 34 is air-tightly sealed to be in the atmospheric state.

In the above embodiments, the plane vibrator 5 of the angular velocity sensor 2 and the movable member 20 of the acceleration sensor have the shapes and sizes shown in FIG. 1. The shapes and sizes of the vibrator for the angular velocity sensor and the movable member for the acceleration sensor are not limited to those of FIG. 1, and various forms can be employed.

Further, in the above embodiments, the glass substrate and the silicon substrate are described as being anode-joined to each other; however, any other well known method of joining glass to silicon may also be used.

According to the present invention, the vibrator of the angular velocity sensor and the movable member of the acceleration sensor are formed by use of the same displacement portion forming member disposed on the substrate, and the vibrator of the angular velocity sensor and the movable member of the acceleration sensor are accommodated and disposed in the different spaces. Furthermore, the vibrator of the angular velocity sensor is disposed in the vacuum state in which the vibrator of the angular velocity sensor can be vibrated at a high frequency of kHz order or higher and a set amplitude or larger, and the movable member of the acceleration sensor is disposed in the air-pressure state for suppression of high frequency vibration (that is, in the state, the movable member of the acceleration sensor can be vibrated at a low frequency of up to 100 Hz, and even if vibration of the vibrator of the angular velocity sensor is transmitted to the movable member of the acceleration sensor, the movable member is prevented from vibrating at a high frequency and a set amplitude or larger), or in the state thereof in which the damping agent for suppression of high frequency vibration is filled.

Therefore, the vibrator of the angular velocity sensor can be satisfactorily vibrated at a high frequency, due to the vacuum state, and can detect an angular velocity at a high sensitivity. Moreover, even if the high frequency vibration of the vibrator of the angular velocity sensor is transmitted to the acceleration sensor side, the movable member of the acceleration sensor can be suppressed from vibrating at a high frequency and a large amplitude, due to the air-pressure state for suppression of high frequency vibration or the damping agent. Thus, problems on the deterioration in sensitivity, caused by high frequency vibration of the movable member of the acceleration sensor, can be prevented. The acceleration can be also detected at a high sensitivity. As seen in the above-description, a composite sensor device of the detection sensitivities of an angular velocity and an acceleration can be provided.

Moreover, the movable member of the acceleration sensor is disposed in the air-pressure state for suppression of high frequency vibration, or is disposed in the damping agent for suppression of high frequency vibration. Accordingly, when an acceleration having a resonance frequency component for the movable member is applied, the movable member can be prevented from becoming resonant, and can be moved correspondingly to the degree of the applied acceleration. Thereby, the acceleration having a resonance frequency component for the movable member can be correctly detected. Thus, the reliability of acceleration detection can be enhanced.

Preferably, the substrate is formed of the supporting layer and the oxide layer of the SOI substrate, and the displacement portion forming member is formed of the active layer of the SOI substrate. In this case, the substrate and the displacement portion forming member are joined together beforehand. Thus, it is unnecessary to join the base and the displacement portion forming member to each other in the process of producing the composite sensor device. The production process can be simplified.

More preferably, the connection electrode commonly used for the constant potential site of the angular velocity sensor and that of the acceleration sensor is provided. Thus, the composite sensor device can be reduced in size, as compared with connection electrodes exclusively used for the constant potential site of the angular velocity sensor and that for the constant potential site of the acceleration sensor provided separately from each other.

According to the method of producing the composite sensor device of the present invention, the vibrator of the angular velocity sensor and the movable member of the acceleration sensor are simultaneously formed. Thus, the production process can be simplified. In addition, the detection axis of the angular velocity sensor and the acceleration sensor can be prevented from shifting. Furthermore, according to the production method of the present invention, the angular velocity sensor space and the acceleration sensor space can be hermetically sealed to be in the different states.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A composite sensor device including an angular velocity sensor and an acceleration sensor comprising:
   a substrate;
   a displacement portion forming member disposed on the substrate, the displacement portion forming member including a vibrator for an angular velocity sensor, to be vibrated and displaced by a Coriolis force caused by an angular velocity and a movable member for an acceleration sensor, to be movably displaced by application of an acceleration, the vibrator and the movable member being spaced from each other; and a lid disposed on an upper side of the displacement portion forming member to cover and be spaced from the vibrator of the angular velocity sensor and the movable member of the acceleration sensor; wherein the substrate, the displacement portion forming member and the lid, define a space for accommodating and sealing the vibrator of the angular velocity sensor and the movable member of the acceleration sensor, in such a manner that the vibrator and the movable member can be vibrated, the space being sectioned into an angular velocity sensor space for accommodating and sealing the vibrator of the angular velocity sensor and an acceleration sensor space for accommodating and sealing the movable member of the acceleration sensor which is not communicated with the angular velocity sensor space, the angular velocity sensor space is sealed in a vacuum state in which the vibrator of the angular velocity sensor can be vibrated at a high frequency in the kHz range or greater and at an amplitude that is greater than a desired value;

the acceleration sensor space is sealed in an atmospheric pressure state for preventing high-frequency vibrations in which the movable member of the acceleration sensor can be vibrated at a low frequency of 100 Hz or less, and the movable member of the acceleration sensor is prevented from vibrating at a high frequency in the kHz range or greater and at an amplitude that is greater than the desired value even when vibrations of the vibrator of the angular velocity sensor are transmitted to the movable member of the acceleration sensor;

the angular velocity sensor and the acceleration sensor have constant potential sites so that the sensors are maintained at set constant potentials, respectively, said constant potential site of the angular velocity sensor being electrically connected to the constant potential site of the acceleration sensor; and a connection electrode is arranged to connect both of the constant potential site of the angular velocity sensor and the constant potential site of the acceleration sensor to an external circuit.

2. A composite sensor device according to claim 1, wherein a damping agent fills the acceleration sensor space.

3. A composite sensor device according to any one claims 1, wherein the substrate is an SOI substrate comprising a supporting layer, an oxide layer, and an active layer laminated together, and the displacement portion forming member is made from the active layer of the SOI substrate.

* * * * *